US011606879B2

(12) United States Patent
Gao

(10) Patent No.: US 11,606,879 B2
(45) Date of Patent: Mar. 14, 2023

(54) MULTI-PHASE CHANGE THERMAL MANAGEMENT SYSTEMS FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 17/355,681

(22) Filed: Jun. 23, 2021

(65) Prior Publication Data

US 2022/0418147 A1 Dec. 29, 2022

(51) Int. Cl.
*H05K 7/20* (2006.01)

(52) U.S. Cl.
CPC ......... *H05K 7/203* (2013.01); *H05K 7/20318* (2013.01); *H05K 7/20327* (2013.01); *H05K 7/20818* (2013.01)

(58) Field of Classification Search
CPC ............. H05K 7/203; H05K 7/20318; H05K 7/20327; H05K 7/20818; F28D 15/0266
See application file for complete search history.

(56) References Cited

U.S. PATENT DOCUMENTS

| | | | | | |
|---|---|---|---|---|---|
| 4,306,613 A | * | 12/1981 | Christopher | .......... | F25B 23/006 165/104.34 |
| 5,099,908 A | * | 3/1992 | Taraci | ................ | G01R 31/2891 374/57 |
| 5,297,621 A | * | 3/1994 | Taraci | ................... | H05K 7/203 324/750.08 |
| 10,123,454 B2 | * | 11/2018 | Saito | ................... | H05K 7/20236 |
| 10,448,543 B2 | * | 10/2019 | Farshchian | ............... | G06F 1/20 |
| 10,687,441 B2 | * | 6/2020 | Parnes | ....................... | G06F 1/20 |
| 11,076,508 B2 | * | 7/2021 | Gao | .................... | H05K 7/20836 |
| 11,109,517 B2 | * | 8/2021 | Farshchian | ........ | H05K 7/20672 |
| 11,392,184 B2 | * | 7/2022 | Alissa | ................. | H05K 7/20318 |
| 2020/0404805 A1 | * | 12/2020 | Gao | .................... | H05K 7/20781 |
| 2021/0102294 A1 | * | 4/2021 | Miljkovic | ............. | C23C 14/205 |
| 2022/0187023 A1 | * | 6/2022 | Kang | .................... | F28D 1/0226 |

\* cited by examiner

*Primary Examiner* — Robert J Hoffberg
(74) *Attorney, Agent, or Firm* — Womble Bond Dickinson (US) LLP

(57) ABSTRACT

An immersion cooling system includes an immersion tank and one or more information technology (IT) equipment, the IT equipment is configured to provide IT services and is at least partially submerged within a first phase change liquid within the immersion tank, where, when the IT equipment provides the IT services, the IT equipment generates heat that is transferred to the first phase change liquid thereby causing at least some of the first phase change liquid to turn into vapor phase. The cooling system includes a condenser unit having a second phase change liquid circulating at the condenser unit. The condenser unit includes a vacuum port, a sealing valve at the vacuum port. The cooling system includes a heat exchange core, coupling within the immersion tank connecting with the condenser unit to carry heat from the first phase change liquid to the second phase change liquid.

20 Claims, 4 Drawing Sheets

US 11,606,879 B2

MULTI-PHASE CHANGE THERMAL MANAGEMENT SYSTEMS FOR SERVERS

FIELD OF THE INVENTION

Embodiments of the present invention relate generally to servers and data center cooling. More particularly, embodiments of the invention relate to multi-phase change thermal management systems for servers.

BACKGROUND

Thermal management for a data center that includes several active electronic racks is critical to ensure proper performance of servers and/or other information technology (IT) equipment (e.g., performing IT services) that is operating in the racks.

Recently, data centers have been deploying more high-power density electronic racks, where more high-density chips are packaged closer together to provide more computing power and low communication overhead. Cooling these high-density racks by maintaining a proper thermal environment may be an issue with existing cooling systems, such as any air cooling based system.

Immersion cooling, which involves at least partially submerging electronics in a dielectric solution, is a feasible solution for high-density electronics. Implementing immersion cooling in existing data centers, however, has challenges. For example, a data center's cooling infrastructure may need to be modified to be able to support operating an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center.

Existing solutions for immersion cooling have a fixed cooling capacity or otherwise have mechanical moving parts. Solutions with a fixed cooling capacity lack the flexibility to achieve additional cooling performance. Moving mechanical parts can reduce the overall reliability of the cooling solutions.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
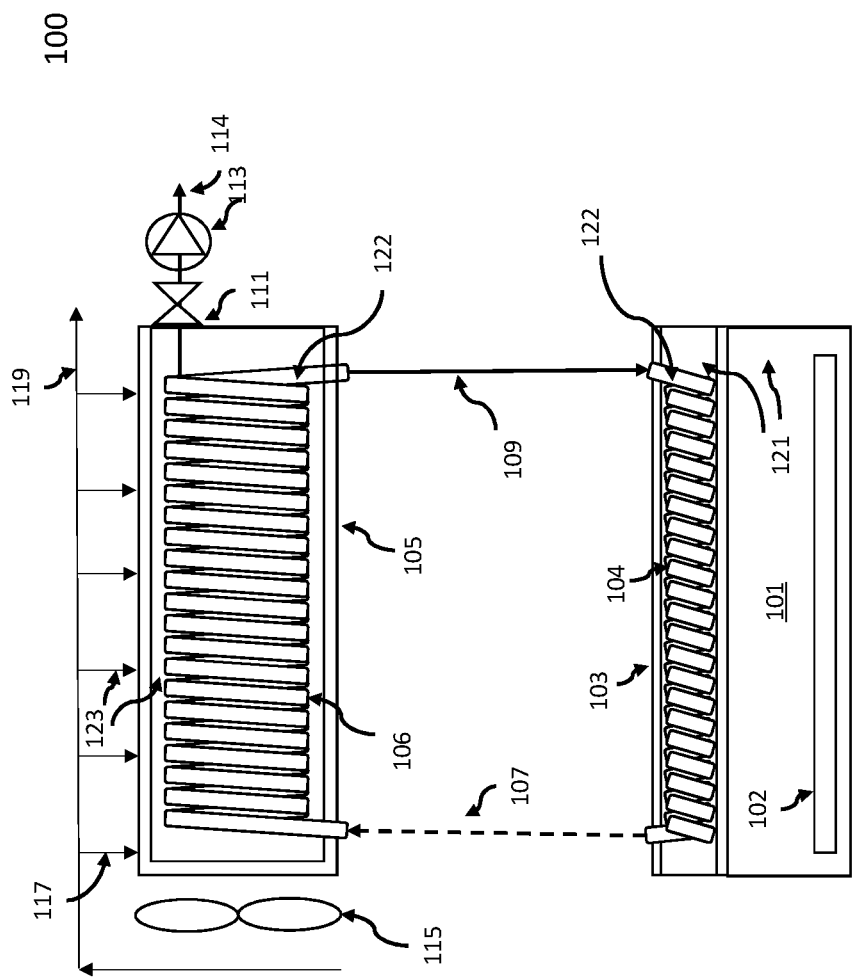
FIG. 1 is a block diagram illustrating an immersion cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspects of the present disclosure are directed to a phase change immersion cooling system with two stages of phase change cooling. The servers and IT equipment are submerged in a first phase change liquid/fluid (e.g., immersion fluid) at a first stage of phase change cooling. The immersion fluid evaporates into vapor and condensing coil at a multiple phase heat exchange core is used to cool the vapor back to liquid. The multiple phase heat exchange core is cooled in a thermosiphon cycle by a second stage of phase change cooling. The second stage includes a condenser located above the multiple phase heat exchange core, and a secondary two phase fluid that is used to cool the vapor of the immersion fluid, where the secondary two phase fluid evaporates to a vapor and condensed at the condenser.

The condenser can be cooled with external cooling, such as a fan, and can be equipped with an evaporative cooling system. At the condenser, a system vacuum port can be used to provide a negative pressure (e.g., vacuum) within a secondary phase change fluid system that is of the second stage. The negative pressure applied to the secondary phase change fluid system can alter the boiling point of the second phase change liquid/fluid contained in the secondary phase change fluid system, thus, providing flexibility in design for selection of the secondary phase change fluid, where the selection of the second phase change fluid should have a lower boiling point than the first phase change fluid.

According to a first aspect, an immersion cooling system includes an immersion tank to contain one or more IT equipment situated within the immersion tank. The IT equipment includes one or more processors, memory, a storage device, etc. that represent one or more servers. The IT equipment is configured to provide IT services and is at least partially submerged within a first phase change liquid, where, when the IT equipment provides the IT services, the IT equipment generates heat that is transferred to the first phase change liquid thereby causing at least some of the first phase change liquid to turn into vapor phase. The immersion cooling system includes a condenser unit having a second phase change liquid circulating at the condenser unit. The condenser unit includes a vacuum port, a sealing valve at the vacuum port to seal in a pressure at the condenser unit, and a heat exchange core, coupling the immersion tank to the condenser unit to carry heat from the first phase change liquid to the second phase change liquid, where the heat exchange core is to condense the first phase change liquid from a vapor phase to liquid phase.

In one embodiment, the immersion cooling system further includes an external cooling unit coupled to the condenser unit, the external cooling unit includes an air blower that blows an airflow through one or more condensing coils of the condenser unit and a cooling nozzle to spray one or more condensing coils of the condenser unit using a cooling liquid medium (e.g., water) from an ambient source. In one embodiment, the heat exchange core is situated above the immersion tank but below the condenser unit.

In one embodiment, the heat exchange core includes a set of pipes or tubes, wherein vapor of the first phase change liquid circulates at an interior to the set of pipes, wherein the second phase change liquid in contact with an exterior to the set of pipes extracts heat from the vapor causing the vapor to condense to liquid phase. In one embodiment, boiling point of the second phase change liquid is lower than boiling point of the first phase change liquid.

In one embodiment, the condenser unit comprises a riser compartment and a down comer compartment, wherein second phase change liquid in vapor phase rises in the riser compartment and second phase change liquid in liquid phase falls down in the down comer compartment. In one embodiment, the boiling point of the second phase change liquid is adjustable and controlled based on a negative pressure applied at the condenser unit.

In one embodiment, the first phase change liquid circulates between the heat exchange core and the immersion tank in a first sealed containment, and where the second phase change liquid circulates between the heat exchange core and the condenser unit in a second sealed containment. In one embodiment, the first phase change liquid is a same liquid as the second phase change liquid, or the first phase change liquid is different from the second phase change liquid. In one embodiment, the condenser unit further includes a backup coolant storage unit to store additional second phase change liquid.

According to a second aspect, a data center system includes a number of immersion cooling systems each providing immersion cooling to a set of IT equipment. Each immersion cooling system includes an immersion tank to contain a set of one or more information technology (IT) equipment situated within the immersion tank, the IT equipment is configured to provide IT services and is at least partially submerged within a first phase change liquid, where, when the IT equipment provides the IT services, the IT equipment generates heat that is transferred to the first phase change liquid thereby causing at least some of the first phase change liquid to turn into vapor phase. The immersion cooling system includes a condenser unit having a second phase change liquid circulating at the condenser unit. The condenser unit includes a vacuum port, a sealing valve at the vacuum port to seal in a pressure at the condenser unit, and a heat exchange core, coupling the immersion tank to the condenser unit to carry heat from the first phase change liquid to the second phase change liquid, where the heat exchange core is to condense the first phase change liquid from a vapor phase to liquid phase.

FIG. 1 is a block diagram illustrating a side view of an immersion cooling system 100 according to one embodiment. Specifically, this figure shows an immersion cooling system 100 (hereafter referred as cooling system) that is configured to immersion cool one or more pieces of information technology (IT) equipment 102, which are at least partially submerged in an immersion cooling fluid contained within the immersion tank 101. Immersion cooling system 100 can be a cooling system as part of a data center. In one embodiment, cooling system 100 includes immersion tank 101 and a two-phase immersion tank internal heat exchange core 103. Immersion tank 101 can contain a first phase change fluid 121 that is used to cool the IT equipment 102 submerged in the immersion tank 101. Immersion tank 101 can include IT equipment 102 located within immersion tank 101.

IT equipment 102 include typical electronic devices that present one or more data processing systems or servers, such as, processors, memory, storage devices, network interfaces, etc. At least some of these electronic devices, when operate (e.g., data processing), generate heat. IT equipment 102 can be configured to provide IT services. Specifically, IT equipment 102 may include a host server (referred to as a host node) and/or one or more compute servers (also referred to as computing nodes, such as CPU server and GPU server). The host server (having one or more CPUs) typically interfaces with clients (not shown in FIG. 1) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, IT equipment 102 may perform any type of computing task and/or may be any type of computing device (e.g., a server, a storage device, etc.). In one embodiment, IT equipment 102 may be edge computing devices. Thus, while IT equipment 102 provide the IT services, the equipment generates heat that is transferred into the first phase change fluid.

Referring to FIG. 1, the first phase change fluid 121 within immersion tank 101 can absorb heat from IT equipment 102 which can cause the first phase change fluid 121 to change to a vapor phase. The vapor rises into heat exchange core 103, where the vapor is condensed back into liquid phase by heat exchange core 103. The first phase change fluid 121 in liquid phase then falls down into immersion tank 101 completing a phase change cycle.

In one embodiment, heat exchange core 103 includes a set of thermally conductive pipes 104, where the set of thermal conductive pipes 104 carries a second phase change fluid 122 in liquid phase to be in thermal contact with, and to condense, the first phase change fluid 121 in its vapor phase, where the set of thermal conductive pipes 104 provides a physical separation for the second phase change fluid 122 in liquid phase from the first phase change fluid 121 in its vapor phase. Although shown as a single coil for ease of illustration, thermal conductive pipes 104 can include multiple coils, or coils arranged in other manners to increase a surface area of thermal conductive pipes 104 for heat transfer, such as serpentine coils, coils with fins, etc.

In one embodiment, heat exchange core 103 is coupled to a cooling loop that operates by a natural convection-based thermosiphon cycle. The cooling loop includes riser 107 (e.g., also referred to as a vapor supply line from heat exchange core 103 to condenser 105), downcomer 109 (e.g., also referred to as a liquid return line from condenser 105 to heat exchange core 103), and condenser 105. Riser 107 and downcomer 109 can include pipes or vent, or any physical separate spacing to form two physical channels. Second phase change fluid 122 in liquid phase can flow down by gravity via downcomer 109 to heat exchange core 103. Second phase change fluid 122 can absorb heat from heat exchange core 103 and evaporate to vapor phase, where the second phase change fluid 122 in vapor phase rises via riser 107. The vapor then reaches condenser 105, where condenser 105 condenses the second phase change fluid 122 back to liquid phase.

In one embodiment, condenser 105 is located above immersion tank 101. In one embodiment, condenser 105 can include condensing coils 106. Although shown as a single coil for ease of illustration, condensing coils 106 can include multiple coils, or coils arranged in other manners to increase a surface area of condensing coils 106 for heat transfer, such as serpentine coils, coils with fins, etc. In one embodiment, condenser 105 includes a vacuum port 114 to provide a negative pressure or a vacuum environment within condenser 105. Condenser 105 can include a sealing valve 111 and/or vacuum pump device 113 to seal in a negative pressure. In one embodiment, vacuum port 114 can be coupled to an external vacuum device (not shown) to generate a negative pressure environment for condenser 105.

In one embodiment, condenser 105 is thermally coupled to an external cooling unit 119. External cooling unit 119 can include an air blower 115 which pushes an airflow passing through air spacing formed by condensing coils 106 of condenser 105. In one embodiment, external cooling unit 119 can include evaporative cooling nozzles 117 to spray a third phase change fluid 123 at condenser 105 to cool condenser 105, where the third phase change fluid 123 is at an ambient temperature. Note that the third phase change fluid 123 at an ambient temperature should have a lower web-bulb and dry-bulb ambient temperature than condenser 105 and the second phase change fluid 122 at condenser 105.

Figure 2:
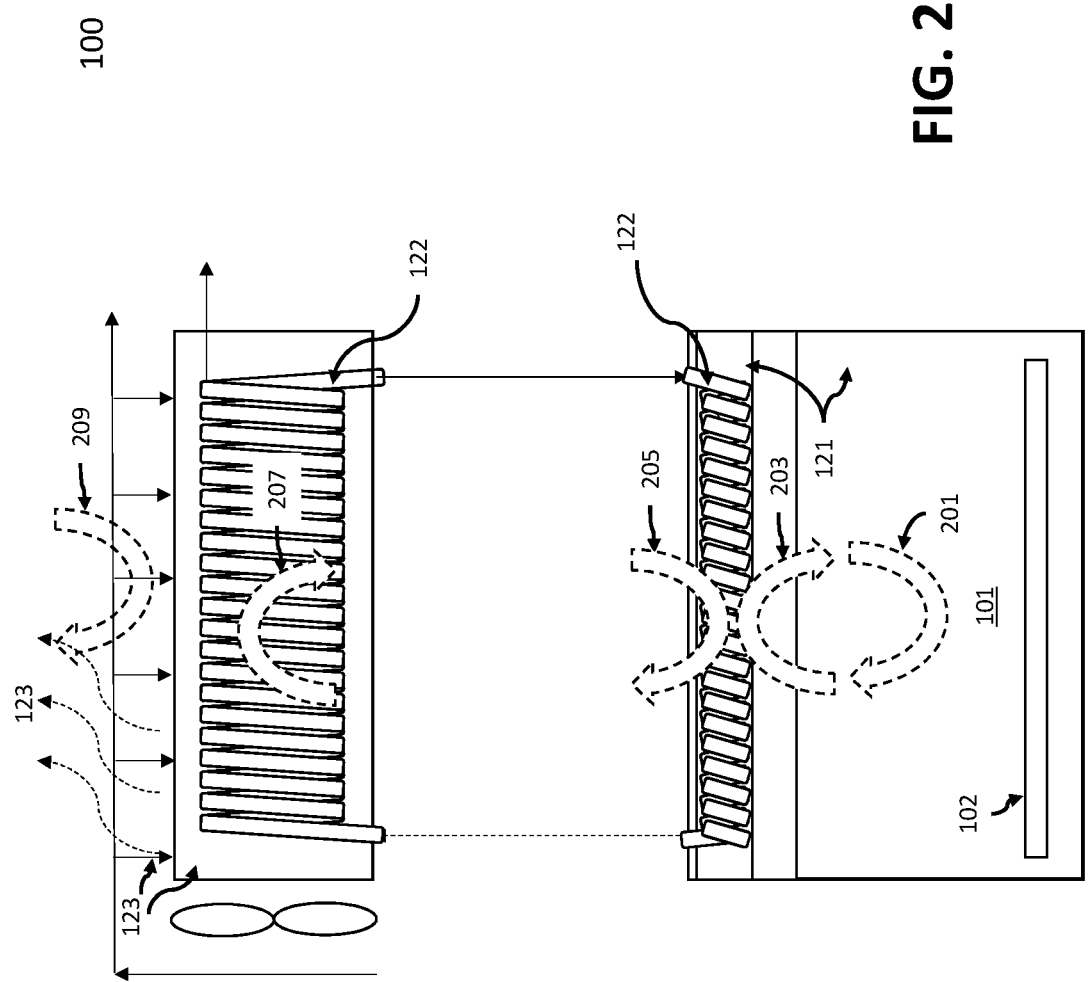
FIG. 2 is a block diagram illustrating phase change cycles of an immersion cooling system according to one embodiment.

FIG. 2 is a block diagram illustrating phase change cycles of an immersion cooling system 100 according to one embodiment. FIG. 2 illustrates a number of internal and/or external phase change cycles for first and second phase change fluids and/or third fluid. For example, cycle 201 represents the first phase change fluid 121 that changes from liquid to vapor phase extracting heat, which occurs when the first phase change fluid 121 is in thermal contact with IT equipment 102 at immersion tank 101. Cycle 203 represents the first phase change fluid 121 that is condensed from vapor to liquid phase by the heat exchange core 103.

Cycle 205 represents the second phase change fluid 122 that changes from liquid to vapor phase at the heat exchange core 103. The heat exchange core 103 operates as a condenser to condense the vapor evaporated from the first phase change fluid 121 from immersion tank 101 using the second phase change fluid 122. Cycle 207 represents the second phase change fluid 122 changing from vapor to liquid phase when the second phase change fluid 122 extracts heat from the first phase change fluid 121 at vapor phase at heat exchange core 103. Thus, condenser 105 condenses the vapor from the second phase change fluid 122 using a third phase change fluid 123 during cycle 207. Note that the second phase change fluid 122 should have a lower boiling point than the first phase change fluid 121. In one embodiment, the first phase change fluid 121 is different from the second phase change fluid 122. In one embodiment, the first phase change fluid 121 is a same fluid as the second phase change fluid 122, and a negative pressure is exerted at condenser 205 to cause the boiling point of the second phase change fluid 122 to be lower than the first phase change fluid 121.

Cycle 209 represents the third phase change fluid 123 evaporating from liquid to vapor, when the third phase change fluid 123 is sprayed at a condensing coils 106 carrying the vapor evaporated from the second phase change fluid 122. In one embodiment, the third phase change fluid 123 is water. The third phase change fluid 123 can be sourced externally from a data center, where the third phase change fluid 123 is at ambient temperature. Cycle 209 can be used when air cooling is insufficient for heat removal.

Figure 3:
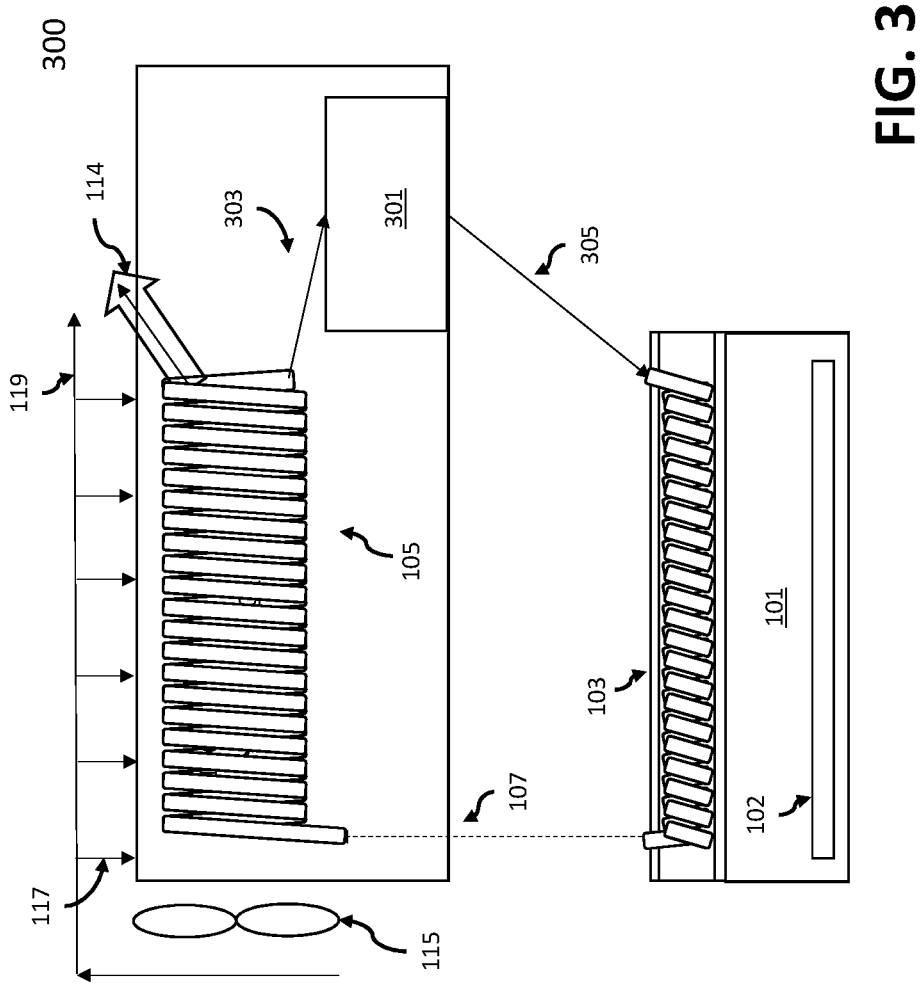
FIG. 3 is a block diagram illustrating an immersion cooling system with an external coolant storage unit according to one embodiment.

FIG. 3 is a block diagram illustrating an immersion cooling system 300 with a backup coolant storage unit according to one embodiment. Cooling system 300 can represent cooling system 100 of FIG. 1. In one embodiment, cooling system 300 includes a backup coolant storage unit 301 for additional design flexibilities. In this scenario, cooling system 300 can include a line 303 that is coupled between backup coolant storage unit 301 and condenser 105, where line 303 is to receive condensed second phase change fluid 122 from condenser 105 to store at backup coolant storage unit 301. In one embodiment, downcomer 305 is coupled to backup coolant storage unit 301 instead of condenser 105 so that fluid can flow from backup coolant storage unit 301 to heat exchange core 103. Backup coolant storage unit 301 can provide additional storage for the second phase change fluid, and additional flexibility in design for condenser 105. For example, condenser 105 can drain second phase change fluid to backup coolant storage unit 301 during services and maintenance.

Figure 4:
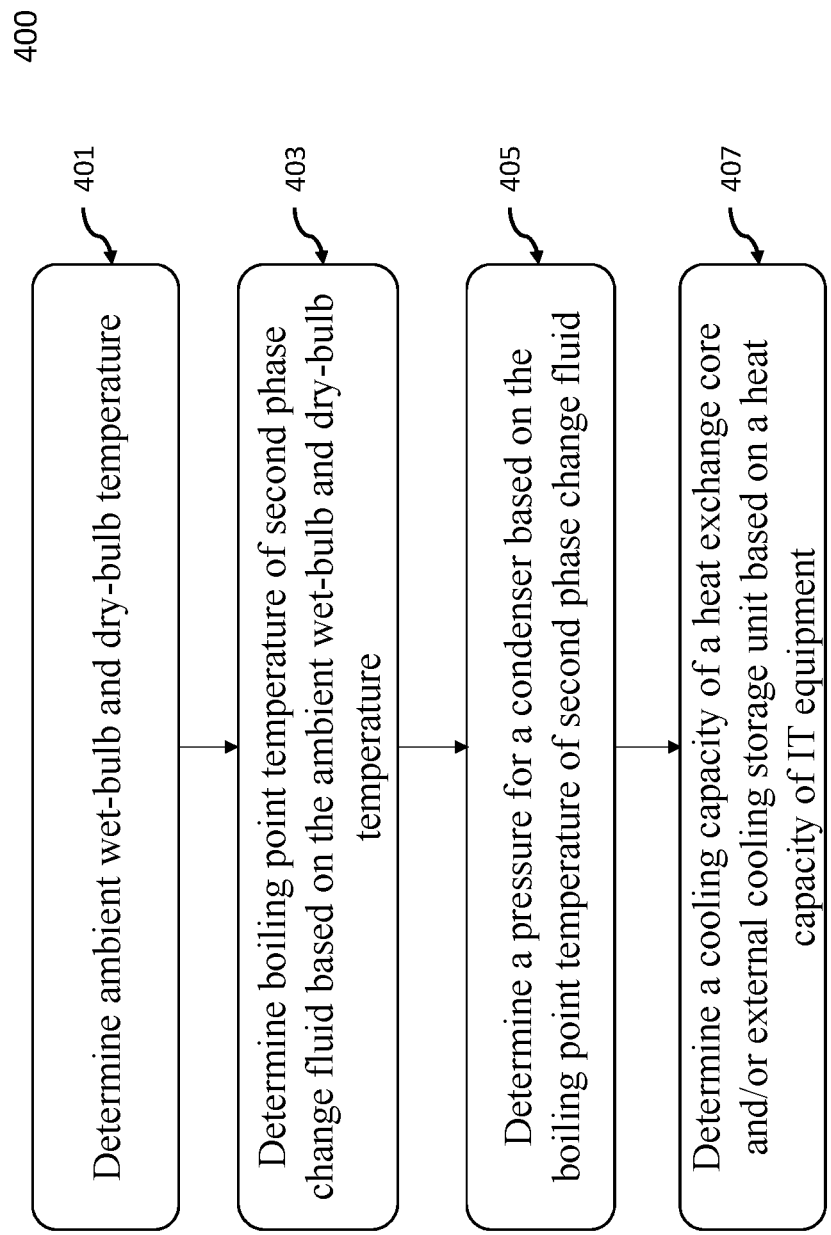
FIG. 4 is a flow diagram illustrating a method to design an immersion cooling system according to one embodiment.

FIG. 4 is a flow diagram illustrating a method to design an immersion cooling system according to one embodiment. Process 400 may be performed by processing logic which may include software, hardware, or a combination thereof. For example, process 400 may be performed by a design automation tool/engine or a computing system, which is used to design a cooling system, such as cooling system 100 of FIG. 1.

Referring to FIG. 4, at block 401, processing logic determines ambient wet-bulb and dry-bulb temperature at an exterior environment of condenser 105 of FIG. 1, where a third phase change fluid 123 can be sourced for cooling. The dry-bulb temperature can be measured by a temperature sensor that is freely exposed to the air, but shielded from moisture. The web bulb temperature can be measured by another temperature sensor covered in water-soaked cloth over which air is passed.

At block 403, processing logic determines a boiling point of second phase change fluid based on the ambient wet-bulb and dry-bulb temperature. The boiling point of second phase change fluid can be selected to be a temperature value less than the ambient wet-bulb and dry-bulb temperature. For example, if the ambient wet-bulb and dry-bulb temperatures are 30, and 35 degrees Celsius, respectively, the boiling point of second phase change fluid can be selected as 25 degrees Celsius.

Typically, at design time, the first phase change fluid is pre-specified by the types of IT equipment to be cooled and thermal management requirements for the IT equipment, as well as some other factors such as fluid compatibility, long term reliability, cost, and so forth. In one embodiment, the second phase change fluid is selected such that the second phase change fluid has a lower boiling point than a boiling point of the first phase change fluid. In one embodiment, the first phase change fluid is a dielectric fluid.

At block 405, in one embodiment, if first phase change fluid is a same liquid as second phase change fluid, processing logic determines a negative pressure to be applied to condenser (condenser 105) based on the boiling point of second phase change fluid, so that the boiling point of second phase change fluid is lower than the first phase change fluid. In one embodiment, if first phase change fluid is different from second phase change fluid, condenser 105 can be set at atmospheric pressure of a data center.

For blocks 403 and 405, in one embodiment, the type of secondary phase change fluid can be selected using design factors such as an overall system performance requirement, the first phase change fluid boiling point, and the wet bulb and dry bulb ambient temperatures. In one embodiment, the type of secondary phase change fluid can be selected based on the range/variation and ease of control for exerting the negative pressure at condenser 105, which allows additional adjustments be made to the boiling point of the second phase change fluid.

At block 407, processing logic determines a cooling capacity of a heat exchange core 103 and/or backup cooling storage unit 301 based on a heat capacity of IT equipment 102. For example, the IT equipment energy consumption (which can infer a heat generation rate) can be used to calculate a cooling rate required for heat exchange core 103. In one embodiment, with a backup cooling storage unit 301, the capacity of backup cooling storage unit 301 can be calculated to be a heat generation rate of the IT equipment energy consumption over a predetermined time period.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system, comprising:
   an immersion tank to contain one or more information technology (IT) equipment at least partially submerged into a liquid phase of a first phase change fluid within the immersion tank, the IT equipment including one or more processors representing one or more severs, wherein, when the IT equipment operates, the IT equipment generates heat that is transferred to the first phase change fluid thereby causing at least some of the liquid phase of the first phase change fluid to turn into a vapor phase;
   a condenser unit having a second phase change fluid circulating at the condenser unit, the condenser unit comprising:
      a vacuum port; and
      a sealing valve at the vacuum port to seal in a pressure at the condenser unit; and
   a heat exchange core, coupling the immersion tank to the condenser unit to carry the heat from the first phase change fluid to the second phase change fluid, wherein the heat exchange core is to condense the first phase change fluid from the vapor phase to the liquid phase.

2. The immersion cooling system of claim 1, further comprising an external cooling unit coupled to the condenser unit, the external cooling unit comprises:
   an air blower that blows an airflow through one or more condensing coils of the condenser unit; or
   a cooling nozzle to spray the one or more condensing coils of the condenser unit using a cooling liquid medium from an ambient source.

3. The immersion cooling system of claim 1, wherein the heat exchange core is situated above the immersion tank but below the condenser unit.

4. The immersion cooling system of claim 1, wherein the heat exchange core comprises a set of pipes, wherein the vapor phase of the first phase change fluid circulates at an exterior to the set of pipes, wherein the second phase change fluid in contact with an interior to the set of pipes extracts the heat from the vapor phase of the first phase change fluid causing the vapor phase of the first phase change fluid to condense to the liquid phase.

5. The immersion cooling system of claim 1, wherein a boiling point of the second phase change fluid is lower than a boiling point of the first phase change fluid.

6. The immersion cooling system of claim 1, wherein the condenser unit comprises a riser compartment and a downcomer compartment, wherein a vapor phase of the second phase change fluid rises in the riser compartment and a liquid phase of the second phase change fluid falls down in the downcomer compartment.

7. The immersion cooling system of claim 1, wherein a boiling point of the second phase change fluid is adjustable based on a negative pressure applied at the condenser unit.

8. The immersion cooling system of claim 1, wherein the first phase change fluid circulates between the heat exchange core and the immersion tank in a first sealed containment, and wherein the second phase change fluid circulates between the heat exchange core and a condenser unit in a second sealed containment.

9. The immersion cooling system of claim 1, wherein the first phase change fluid is a same fluid as the second phase change fluid.

10. The immersion cooling system of claim 1, wherein the condenser unit further comprises a backup coolant storage unit to store an additional quantity of the second phase change fluid.

11. A data center system, comprising:
    a plurality of immersion cooling systems to provide immersion cooling to a plurality sets of information technology (IT) equipment, wherein each of the immersion cooling systems comprises:
       an immersion tank to contain a set of one or more information technology (IT) equipment at least partially submerged into a liquid phase of a first phase change fluid within the immersion tank, the IT equipment including one or more processors representing one or more severs, wherein, when the IT equipment operates, the IT equipment generates heat that is transferred to the first phase change fluid thereby causing at least some of the liquid phase of the first phase change fluid to turn into a vapor phase;
       a condenser unit having a second phase change fluid circulating at the condenser unit, the condenser unit comprising:
          a vacuum port; and
          a sealing valve at the vacuum port to seal in a pressure at the condenser unit; and
       a vapor-to-liquid heat exchange core, coupling the immersion tank to the condenser unit to carry the heat from the first phase change fluid to the second phase change fluid, wherein the vapor-to-liquid heat exchange core is to condense the first phase change fluid from the vapor phase to the liquid phase.

12. The data center system of claim 11, wherein each of the immersion cooling systems further comprises an external cooling unit coupled to the condenser unit, the external cooling unit comprises:
    an air blower that blows an airflow through one or more condensing coils of the condenser unit; or
    a cooling nozzle to spray the one or more condensing coils of the condenser unit using a cooling liquid medium from an ambient source.

13. The data center system of claim 11, wherein the vapor-to-liquid heat exchange core is situated above the immersion tank but below the condenser unit.

14. The data center system of claim 11, wherein the vapor-to-liquid heat exchange core comprises a set of pipes, wherein the vapor phase of the first phase change fluid circulates at an exterior to the set of pipes, wherein the second phase change fluid in contact with an interior to the set of pipes extracts the heat from the vapor phase of the first phase change fluid causing the vapor phase of the first phase change fluid to condense to the liquid phase.

15. The data center system of claim 11, wherein a boiling point of the second phase change fluid is lower than a boiling point of the first phase change fluid.

16. The data center system of claim 11, wherein the condenser unit comprises a riser compartment and a downcomer compartment, wherein a vapor phase of the second phase change fluid rises in the riser compartment and a liquid phase of the second phase change fluid falls down in the downcomer compartment.

17. The data center system of claim 11, wherein a boiling point of the second phase change fluid is adjustable based on a negative pressure applied at the condenser unit.

18. The data center system of claim 11, wherein the first phase change fluid circulates between the vapor-to-liquid heat exchange core and the immersion tank in a first sealed containment, and wherein the second phase change fluid circulates between the vapor-to-liquid heat exchange core and the condenser unit in a second sealed containment.

19. The data center system of claim 11, wherein the first phase change fluid is a same fluid as the second phase change fluid.

20. The data center system of claim 11, wherein the condenser unit further comprises a backup coolant storage unit to store an additional quantity of the second phase change fluid.

* * * * *